United States Patent [19]

Ito et al.

[11] Patent Number: 5,323,025
[45] Date of Patent: Jun. 21, 1994

[54] PYROELECTRIC IR-SENSOR HAVING A LOW THERMAL CONDUCTIVE CERAMIC SUBSTRATE

[75] Inventors: Satoru Ito, Machida; Michihiro Murata; Norio Fukui, both of Kyoto; Keizou Yamamoto, Osaka; Tetsujiro Sawao, Himi; Satoshi Awata, Takaoka; Yasuo Tada, Kyoto; Satoru Kawabata, Hikone, all of Japan

[73] Assignee: Murata Mfg. Co., Ltd., Kyoto, Japan

[21] Appl. No.: 998,891

[22] Filed: Dec. 29, 1992

Related U.S. Application Data

[63] Continuation of Ser. No. 689,715, Apr. 22, 1991, abandoned, which is a continuation of Ser. No. 521,512, May 10, 1990, abandoned.

[30] Foreign Application Priority Data

May 18, 1989 [JP] Japan .................................. 1-125568
May 18, 1989 [JP] Japan .................................. 1-125569

[51] Int. Cl.⁵ ..................... H01L 29/66; H01L 27/14; H01L 31/00; G01J 5/00
[52] U.S. Cl. .......................... 257/81; 257/79; 257/80; 257/99; 257/444; 250/338.1; 250/338.3
[58] Field of Search ..................... 357/46, 74, 81, 72, 357/19, 30, 17, 75, 84; 250/338.1, 338.3; 257/81, 79, 80, 82, 99, 100, 444

[56] References Cited

U.S. PATENT DOCUMENTS

| | | |
|---|---|---|
| 3,539,803 | 11/1970 | Beerman .................. 357/75 |
| 3,581,092 | 5/1971 | Pearsall . |
| 4,258,260 | 3/1981 | Obara et al. . |
| 4,293,768 | 10/1981 | Adachi et al. ................ 357/72 |
| 4,302,674 | 11/1981 | Adachi et al. ................ 357/72 |
| 4,336,452 | 6/1982 | Baker ...................... 250/338.3 |
| 4,489,238 | 12/1984 | Baker ...................... 357/72 |
| 4,516,027 | 5/1985 | Schimmelpfennig et al. ... 250/338.3 |
| 4,556,796 | 12/1985 | Renals ..................... 250/338.3 |
| 4,561,010 | 12/1985 | Ogihara et al. .............. 357/81 |
| 4,682,030 | 7/1987 | Rose et al. ................. 250/338.3 |
| 4,803,360 | 2/1989 | Ball et al. ................. 250/338.3 |
| 4,806,763 | 2/1989 | Turnbull ................... 250/338.3 |
| 4,825,079 | 4/1989 | Takamatsu et al. . |
| 4,906,834 | 3/1990 | Quad et al. . |
| 4,916,505 | 4/1990 | Holm-Kennedy .............. 357/46 |
| 4,956,554 | 9/1990 | Baker et al. ............... 250/338.3 |

FOREIGN PATENT DOCUMENTS 0184747 8/1985 European Pat. Off. .
3319705 12/1984 Fed. Rep. of Germany .
57-175929 10/1982 Japan .

Primary Examiner—Andrew J. James
Assistant Examiner—Carl Whitehead, Jr.
Attorney, Agent, or Firm—Jordan and Hamburg

[57] ABSTRACT

A pyroelectric IR-sensor in which a pyroelectric light receiving element is mounted on a MID substrate or a ceramic substrate of which thermal conductivity is less than 0.02 cal/cm.sec.° C. in a manner that both end portions of the pyroelectric light receiving element are supported by the substrate with the central portion of the pyloelectric light receiving element being spaced from the substrate, and chip parts are further mounted on the substrate.

7 Claims, 4 Drawing Sheets

PYROELECTRIC IR-SENSOR HAVING A LOW THERMAL CONDUCTIVE CERAMIC SUBSTRATE

"This application is a continuation of application Ser. No. 07/689,715, filed Apr. 22, 1991 (now abandoned), said Ser. No. 07/689,715 being a continuation of Ser. No. 07/521,512, filed May 10, 1990 (now abandoned)."

BACKGROUND OF THE INVENTION

1. Field of the Invention

This invention relates to a pyroelectric IR-sensor (infrared sensor), and more particularly to a pyroelectric IR-sensor which have excellent characteristics and is easy in manufacturing.

2. Description of the Prior Art

A conventional pyroelectric IR-sensor essentially comprises a pyroelectric light receiving element, a substrate or base plate of alumina for supporting the pyroelectric light receiving element in a manner that this pyroelectric light receiving element is spaced from the substrate by spacing pads, and provided with a wiring pattern and a resistor formed on the surface thereof, and an FET chip mounted on the substrate.

The method of manufacturing the above-mentioned pyroelectric IR-sensor will be described hereinafter.

At first, a substrate is provided by forming a wiring pattern and a resistor by silk screen printing and baking on an alumina plate molded in a predetermined shape. Next, a FET chip is soldered onto the substrate. Then, a conductive paste is put on the substrate, the top of the paste and suitably the paste is flattened hardened to provide spacing pads. Finally, a pyroelectric light receiving element is bonded on the spacing pads.

Since the pyroelectric light receiving element serves to sense changes in temperature in response to infrared rays, this element must be thermally isolated from other components.

To realize this, in the above-mentioned conventional pyroelectric IR-sensor, the pyroelectric light receiving element is spaced from the substrate by the spacing pads and is thus thermally isolated therefrom.

Since heat is transferred through the spacing pads, however, the thermal isolation is insufficient. Further, since it is extremely difficult to form the spacing pads with a high precision, unevenness occurs in the thermal isolation of the pyroelectric light receiving element. This causes unevenness in the characteristics if the pyroelectric light receiving elements. Furthermore, occurs an unbalance in transfer of heat through the spacing pads which support the pyroelectric light receiving element. This causes the production of noises by an unbalanced voltage.

In addition, it takes a relatively long time in the process for forming the spacing pads. This constitutes obstacle to an improvement in productivity.

SUMMARY OF THE INVENTION

An object of this invention is to provide a pyroelectric IR-sensor which has eliminated the above-mentioned problems by employing a structure in which no spacing pad is required.

In the first aspect, this invention provides a pyroelectric IR-sensor comprising a pyroelectric light receiving element, an MID substrate formed to include element supporting portions for supporting both end portions of the pyroelectric light receiving element with the central portion thereof being spaced from the substrate, and chip parts mounted on the MID substrate.

The MID substrate in the above-mentioned construction is a substrate of a Molded Inter Connection Device or circuit moldings. This substrate is made up or manufactured by a two phase molding process or two shot molding process.

In the above-mentioned pyroelectric IR-sensor, a MID substrate is made of resin having a low thermal conductivity. Further, the pyroelectric light receiving element and the MID substrate are in contact with each other only at both end portions of the pyroelectric light receiving element. Accordingly, even if the pyroelectric light receiving element is directly supported by the element supporting portions of the MID substrate, it can be sufficiently thermally isolated.

As a result, it becomes unnecessary to form a spacing pad and there is no possibility that unevenness in the characteristic or noise by an unbalanced voltage may occur.

Not only the process for forming the spacing pads which require relatively much time becomes unnecessary, but also the three dimensional configuration and the wiring pattern of the MID substrate are integrally formed by the injection molding, therefore productivity can be improved.

In the second aspect, this invention provides a pyroelectric IR-sensor comprising a pyroelectric light receiving element, a substrate including element supporting portions for supporting the ends of the pyroelectric light receiving element with the central portion thereof being spaced from the substrate, having a wiring pattern formed on the surface thereof, and comprised of a ceramic of which thermal conductivity is less than 0.02 cal/cm.sec.° C., and chip parts mounted on the substrate.

In the above-mentioned pyroelectric IR-sensor, the thermal conductivity of the substrate is less than 0.02 cal/cm.sec.° C., which is less than a value one third of that of the conventional sensor of alumina. Further, the pyroelectric light receiving element and the substrate are connected to each other only at both ends of pyroelectric light receiving element. Accordingly, even if the pyroelectric light receiving element is directly supported by the element supporting portions of the substrate, it can be sufficiently thermally isolated.

Thus, it becomes unnecessary to form spacing pads and there is no possibility that unevenness in the characteristic or noises by an unbalanced voltage may occur. In addition since the step which requires a relatively long time becomes unnecessary, productivity can be improved.

DESCRIPTION OF THE PREFERRED EMBODIMENTS

This invention will be described in more detail in accordance with preferred embodiments. It is to be noted that this invention is not limited by these embodiments.

Figure 1:
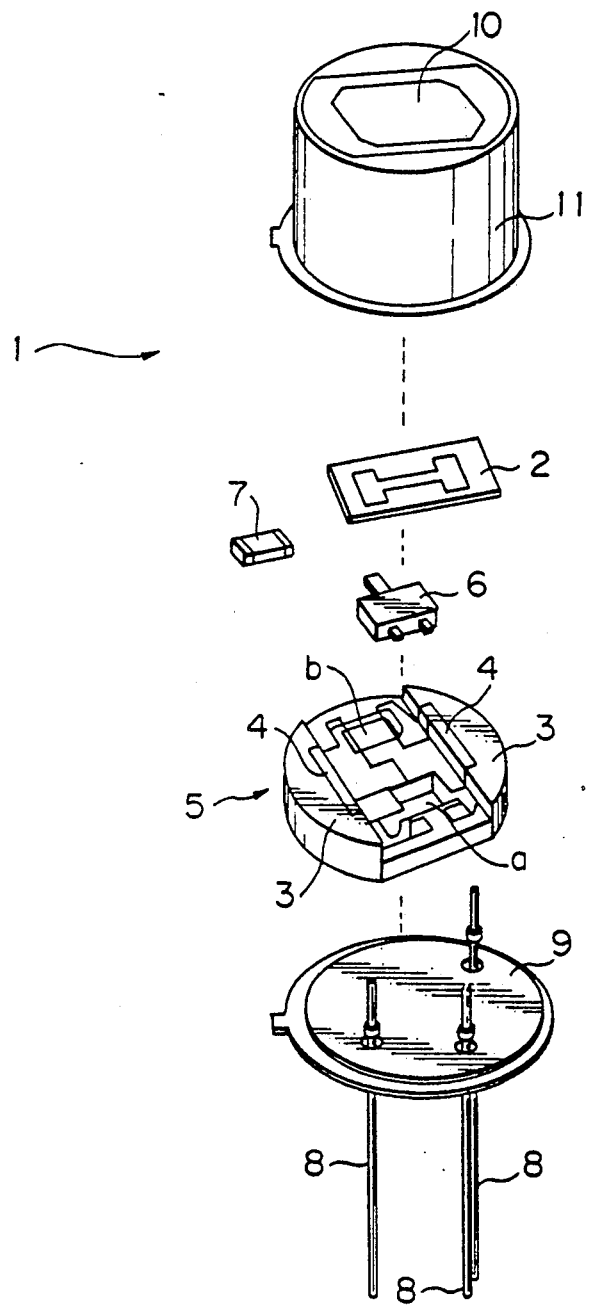
FIG. 1 is an exploded perspective view showing a pyroelectric IR-sensor according to an embodiment of this invention.

In a pyroelectric IR-sensor 1 according to an embodiment of this invention shown in FIG. 1, a pyroelectric light receiving element 2 is the same as the conventional one of the dual-element type.

An MID substrate 5 is made up as follows. First, a catalytic resin is used to injection-mold a catalytic resin portion having a surface that serves as a wiring pattern. Then, a non-catalytic resin is used to injection-mold to make a non-catalytic resin portion of which surface serves as an insulating surface so that it overlaps the catalytic resin portion. Further, a conductive layer is formed on the surface of the catalytic resin portion by electroless plating, thus allowing the conductive layer to be a wiring pattern 4. It is preferable that both the catalytic resin and the non-catalytic resin have a thermal conductivity as small as possible, and a heat-resisting property as high as possible.

The MID substrate 5 is concave so that both end portions of the pyroelectric light receiving element 2 can be supported with the central portion thereof being spaced therefrom.

This MID substrate 5 is mounted on a base 9. Further, an FET chip 6 is mounted on the portion a and a resistor chip 7 is mounted on the portion b of the MID substrate 5.

These components are soldered by solder paste/reflow.

Further, the two end portions of the pyroelectric light receiving element 2 are bonded to the element supporting portions 3 and 3 of the MID substrate 5. It is preferable that this bonding is effective by using a conductive epoxy bonding agent in order to suppress the heat conduction.

Finally, the article thus obtained is sealed by a case 11 having an optical filter 10 as a window and $N_2$ gas is filled therein.

Figure 2:
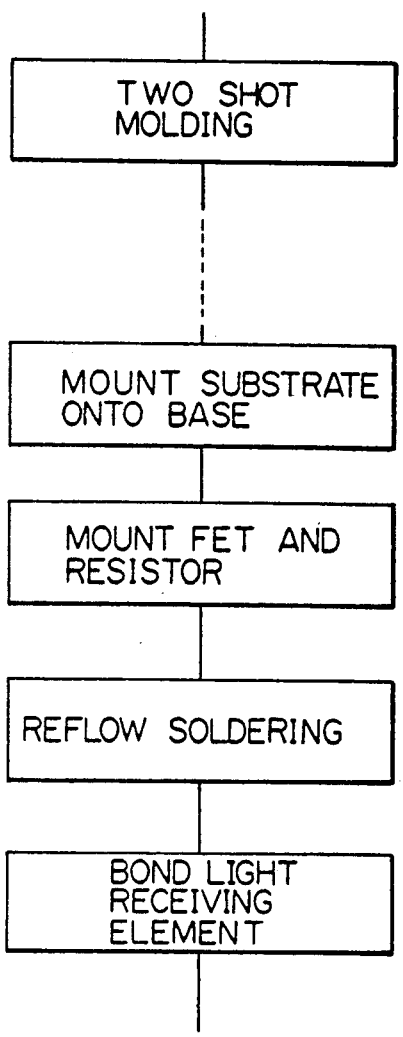
FIG. 2 is a flowchart showing a method of manufacturing the pyroelectric IR-sensor shown in FIG. 1.

FIG. 2 is a flowchart showing the basic part of a method of manufacturing the above-mentioned pyroelectric IR-sensor 1.

Figure 3:
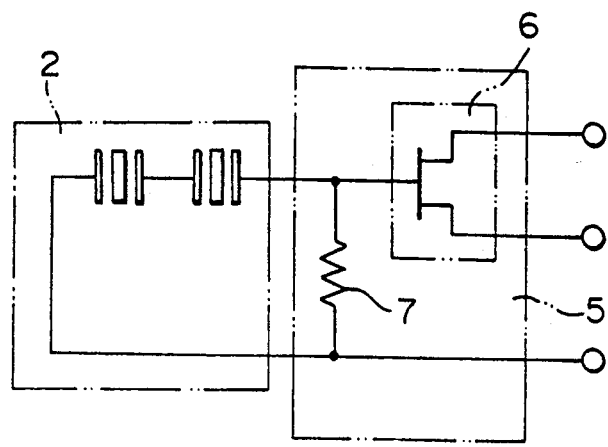
FIG. 3 is an electric circuit diagram of the pyroelectric IR-sensor shown in FIG. 1.

FIG. 3 is an electric circuit diagram thereof.

The following advantages can be provided by the pyroelectric IR-sensor 1.

(1) Since a structure is employed such that the pyroelectric light receiving element 2 is directly supported by the MID substrate 5, the process for forming a spacing pad becomes unnecessary and the manufacturing becomes easy. Further, the mechanical strength is improved, so the pyroelectric light receiving element can tolerate impact or vibrations.

(2) Since a structure is employed such that only the both ends of the pyroelectric light receiving element 2 are supported by a resin having a low thermal conductivity, the thermal isolation becomes satisfactory and unevenness in the characteristic is reduced. Further, the possibility that noises due to an unbalanced voltage may be produced is eliminated.

Figure 4:
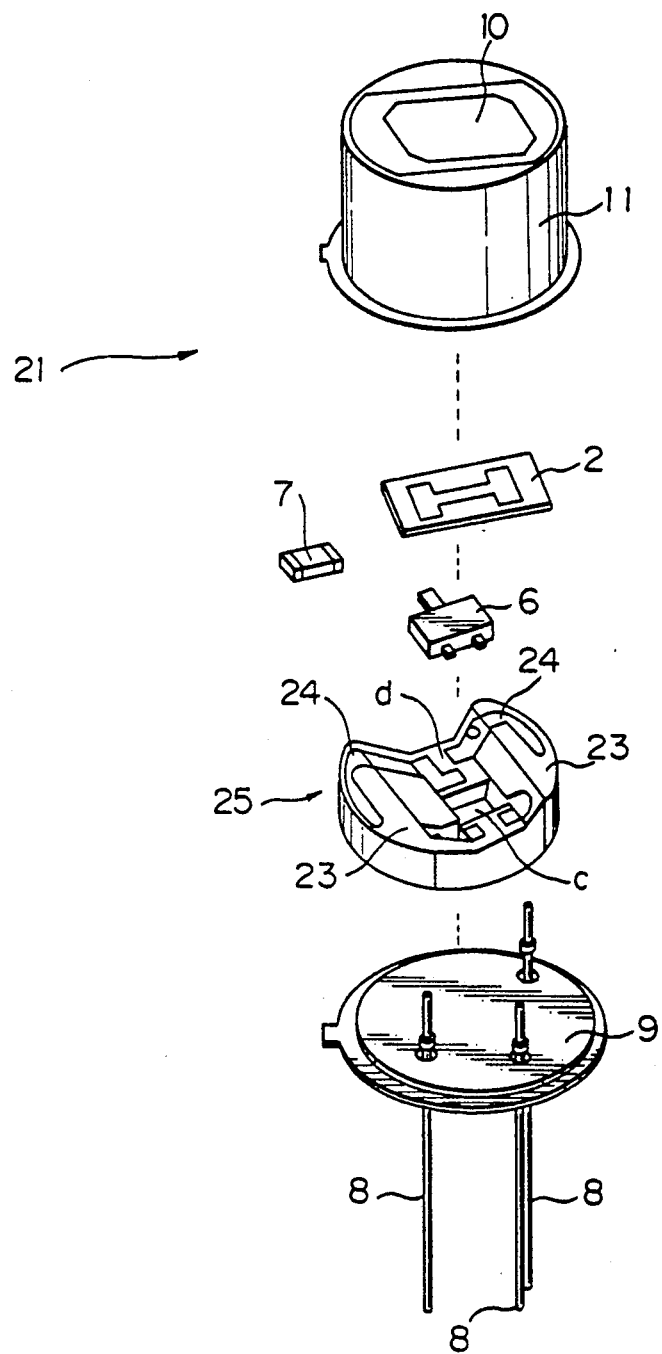
FIG. 4 is a spread perspective view showing a pyroelectric IR-sensor according to another embodiment of this invention.

FIG. 4 shows a pyroelectric IR-sensor 21 according to another embodiment of this invention.

In this pyroelectric IR-sensor 21, the pyroelectric light receiving element 2 is the same as the conventional one.

A substrate 25 is made of a ceramic having a thermal conductivity lower than 0.02 cal/cm.sec.°C. For such a material, $(MgCa)TiO_3$ ceramics having a thermal conductivity of 0.017 cal/cm.sec.°C., a specific dielectric constant of 20, and a specific resistance value more than $10^{13}\Omega$ cm, or $BaO-SiO_2-Al_2O_3$ ceramics having a thermal conductivity of 0.004 cal/cm.sec.°C., a specific dielectric constant of 6, and a specific resistance value more than $10^{13}\Omega$ cm may be used. It is preferable that the thermal conductivity and the specific dielectric constant are as small as possible, and the resistance (volume resistivity) is as high as possible.

The substrate 25 is concave so that the two end portions of the pyroelectric light receiving element 2 can be supported by element supporting portions 23 and 23 with central portion thereof being spaced from the substrate 25.

Further, a wiring pattern 24 of a silver electrode is formed on the surface of the substrate 25 by using a pad type transfer printing. Since wiring pattern 24 can be formed on a three-dimensional body by a single step by using pad type transfer printing, the manufacturing process becomes easy.

This substrate 25 is mounted on an base 9. In addition, a FET chip 6 is mounted on the portion c and a resistor chip 7 is mounted on the portion d of the substrate 25.

These components are soldered by solder paste/reflow.

Further, the two end portions of the pyroelectric light receiving element 2 are bonded to element supporting portions 23 and 23 of the substrate 25. It is preferable that this bonding is effected by using a conductive epoxy bonding agent in order to suppress the heat conduction.

Finally, the article thus obtained is sealed by a case 11 having an optical filter 10 as a window and $N_2$ gas is filled therein.

Figure 5:
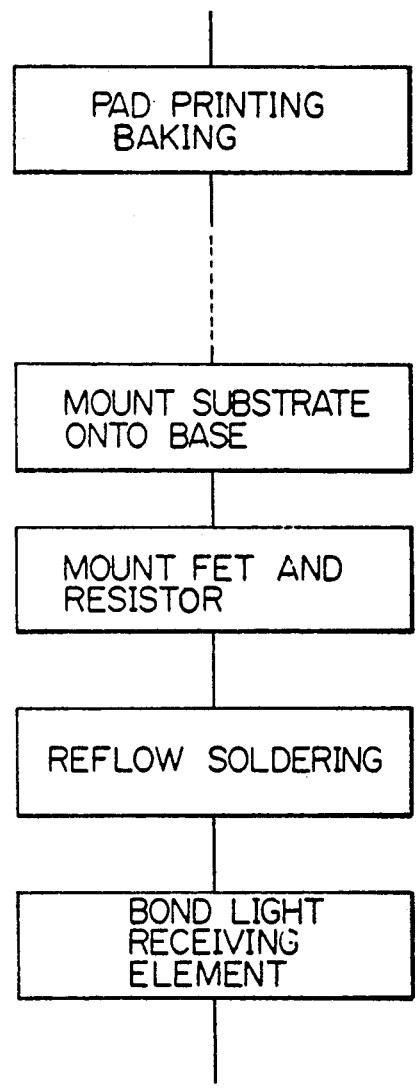
FIG. 5 is a flowchart showing a method of manufacturing the pyroelectric IR-sensor shown in FIG. 4.

FIG. 5 is a flowchart showing the basic part of a method of manufacturing the above-mentioned pyroelectric IR-sensor 21.

The electric circuit diagram in this embodiment is the same as that shown in FIG. 3.

The following advantages can be provided by the above-mentioned pyroelectric IR-sensor 21.

(1) Since a structure is employed such that the pyroelectric light receiving element 2 is directly supported by the MID substrate 25, the process for forming spacing pads becomes unnecessary and the manufacturing becomes easy. Further, the mechanical strength is improved, so the pyroelectric light receiving element can tolerate impact or vibrations.

(2) Since a structure is employed such that a ceramic substrate 25 having a low thermal conductivity is used to support the pyroelectric light receiving element 2 only by the end portions of the substrate 25, the thermal isolation becomes satisfactory and unevenness in the characteristic is reduced. Further, the possibility that noises due to an unbalanced voltage may be produced is eliminated.

What is claimed is:

1. A pyroelectric IR-sensor comprising:
   a pyroelectric light receiving element having first and second opposite sides and first and second opposite ends, and first and second different end connections on said first and second ends respectively, on said first side of said element;
   an electrically insulating a substrate having a concave surface defining first and second spaced apart element supporting portions and a recessed portion between said first and second element supporting portions, a wiring pattern extending between said recessed portion and said first and second element supporting portions continuously along said first surface, said first and second end connections of said light receiving element being soldered directly to the wiring pattern on said first and second element supporting portions, with said first side of said element facing said substrate, said light receiving element being supported solely on said first and second element supporting portions by the first and second end connections, respectively, of said pyroelectric light receiving element, whereby the recessed portion of said substrate is spaced from said first side of said light receiving element, said substrate being comprised of a ceramic having a thermal conductivity lower than 0.02 cal/cm.sec.°C.; and circuit element chip parts mounted on said substrate.

2. A pyroelectric IR-sensor as set forth in claim 1, wherein said ceramic is comprised of at least one element selected from the group consisting of +(MgCa)-TiO$_3$ ceramics and BaO-SiO$_2$-Al$_2$O$_3$ ceramics.

3. The pyroelectric sensor of claim 1 wherein said circuit element chip parts are mounted in the recessed center portion of said substrate.

4. The pyroelectric IR-sensor of claim 1 wherein said connections to said wiring pattern on said first and second element supporting portions comprise the only electrical connections to said light receiving element.

5. The pyroelectric IR-sensor of claim 1 wherein said wiring pattern solely extends along the surface of said supporting portions to connect said end connections to said circuit element chip parts.

6. The pyroelectric IR-sensor of claim 1 wherein said first and second end connections of said light receiving element are located solely adjacent opposite ends of said light receiving element, and said wiring pattern extends solely along the surface of said element support portions and said recessed portion to connect said first and second end connections to said circuit element chip parts.

7. The pyroelectric IR-sensor of claim 1 wherein said element supporting portions are of the same material as said substrate and are formed integrally therewith.

* * * * *